United States Patent
Mori

(10) Patent No.: US 6,562,525 B2
(45) Date of Patent: May 13, 2003

(54) PHOTO MASK TO BE USED FOR PHOTOLITHOGRAPHY, METHOD OF INSPECTING PATTERN DEFECT, AND METHOD OF MANUFACTURING SEMICONDUCTOR DEVICE THROUGH USE OF THE MASK

(75) Inventor: Kiyoshi Mori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 87 days.

(21) Appl. No.: 09/843,693

(22) Filed: Apr. 30, 2001

(65) Prior Publication Data

US 2002/0076623 A1 Jun. 20, 2002

(30) Foreign Application Priority Data

Dec. 18, 2000  (JP) ........................ 2000-384127

(51) Int. Cl.⁷ ................................. G03F 9/00
(52) U.S. Cl. ............................ 430/5; 430/22
(58) Field of Search ................ 430/5, 22, 30; 356/636; 382/144, 145, 149

(56) References Cited

U.S. PATENT DOCUMENTS

| 5,966,201 A | * | 10/1999 | Shiraishi et al. | 355/53 |
| 6,130,747 A | * | 10/2000 | Nomura et al. | 356/239 |
| 6,376,139 B1 | * | 4/2002 | Fujisawa et al. | 430/30 |

FOREIGN PATENT DOCUMENTS

| JP | 10-069066 | 3/1998 |
| JP | 11-211432 | 8/1999 |

* cited by examiner

*Primary Examiner*—S. Rosasco
(74) *Attorney, Agent, or Firm*—McDermott, Will & Emery

(57) ABSTRACT

On the photo mask are drawn product patterns and mask dimension inspection marks to be arranged around the respective product patterns. Each of the mask dimension inspection marks includes a line pattern having a width equal to a line width of the product pattern. Further, each of the mask dimension inspection marks includes a reference pattern that is disposed adjacent to the line pattern. A width of the mask dimension inspection mark is wider than that of the line pattern.

7 Claims, 4 Drawing Sheets

PHOTO MASK TO BE USED FOR PHOTOLITHOGRAPHY, METHOD OF INSPECTING PATTERN DEFECT, AND METHOD OF MANUFACTURING SEMICONDUCTOR DEVICE THROUGH USE OF THE MASK

BACKGROUND OF THE INVENTION

1. Field of the Invention

The present invention relates to a photo mask to be used for photolithography, and to a method of inspecting a pattern defect through use of the photo mask, and to a method of manufacturing a semiconductor device through use of the photo mask.

2. Description of the Background Art

Recently, demand has existed for an increase in the speed and capacity of a semiconductor device, and miniaturization of the device has also been pursued. Development of a system LSI formed from a combination of a semiconductor memory and a logic LSI has also been pursued in accordance with diversification of information processing.

So-called eDRAM (embedded DRAM) having DRAM and a logic LSI mixed therein is mentioned as one example of the system LSI. The eDRAM has the advantageous ability to process massive images at high speed.

FIG. 5 is a cross-sectional view for describing the structure of DRAM acting as a common semiconductor device. As shown in FIG. 5, reference numeral 101 designates a semiconductor substrate; 102 designates an element isolation region; 103 designates a gate insulation film; 104 designates a polysilicon film acting as a conductive film; 105 designates a tungsten silicide (WSi) film; 106 and 107 designate insulation films; 108 designates a side wall protective insulation film; and 109 and 115 designate poly-plugs which come into contact with a storage node. Reference numerals 110, 111, 113, 116, 117, 120 and 122 designate nitride or oxide films, which serve as interlayer dielectric films. Reference numerals 112 and 121 designate metal interconnections; 118 designates a storage node of a lower electrode; and 119 designates an upper electrode.

The semiconductor device (DRAM) such as that shown in FIG. 5 is manufactured by way of a plurality of manufacturing processes; that is, a film-growth process for forming a dielectric film and a conductive film; an etching process for forming a contact hole and a trench; a smoothing process using the CMP technique; and a photolithography process for forming a resist pattern.

Before and after each of the foregoing processes, a pattern defect inspection operation is performed for managing substances stuck to a product (product wafer). The pattern defect inspection operation is an inspection for specifying defective pattern attributable to extraneous matter, insufficient exposure, or etching failures, and is performed through use of an SEM (scanning electron microscope) or an optical microscope. Various types of inspection methods have been available in accordance with applications.

Next, a conventional photo mask to be used for photolithography processes will now be described.

FIG. 6 is a view for describing a conventional photo mask. FIG. 7A is a view for describing a conventional mask dimension inspection mark shown in FIG. 6.

As shown in FIGS. 6 and 7A, reference numeral 10 designates a photo mask; 2 designates a product pattern; 13 designates a mask dimension inspection mark; and 4 designates a line pattern.

The photo mask 10 shown in FIG. 6 is a reticle having drawn thereon a product pattern 2 and mask dimension inspection marks 13 provided on the periphery of the product pattern 2.

The product pattern 2 is a circuit pattern of an actual product.

The mask dimension inspection marks 13 are for measuring the processing precision of a photo mask at the time of production of the photo mask. Patterns of the mask dimension inspection marks 13 are originally unnecessary during the photolithography process. Hence, the patterns of the marks 13 are irrelevant to operation of the semiconductor device.

As shown in FIG. 7A, each of the mask dimension inspection marks 13 includes a plurality of line patterns 4 which are equal in width to that of the product pattern 2.

Next, a method of inspecting pattern defects (also called "defective patternes") using the conventional photo mask 10 will be described.

FIG. 7B is a cross-sectional view for describing a method of inspecting a pattern defect using a conventional photo mask.

As shown in FIG. 7B, a silicon nitride film 22 is formed to a thickness of about 500 angstroms on a semiconductor substrate 21, by the LPCVD method. Next, a silicon oxide film 23 is formed on the silicon nitride film 22 to a thickness of about 8,000 angstroms by the LPCVD method. Further, a photoresist film (not shown) is formed on the silicon oxide film 23.

Next, a wafer is exposed through use of a photo mask 10 shown in FIG. 6, thereby forming a resist pattern (not shown) on the silicon oxide film 23. Further, the wafer is subjected to dry etching while the resist pattern is used as a mask, whereby opening sections 28 corresponding to the mask dimension inspection marks 13 shown in FIG. 7A are formed in the silicon oxide film 23.

Subsequently, a barrier metal film 25 is formed from, for example, TiN or TaN, to a thickness of about 1,000 angstroms on the internal surface of each of the opening sections 28 and the silicon oxide film 23. Next, a tungsten film 26 is formed on the barrier metal film 25 to a thickness of about 4,000 angstroms, by means of sputtering. Further, unnecessary portions of the tungsten film 26 and barrier metal film 25 are removed from the silicon oxide film 23 by means of the CMP technique, whereby a structure such as that shown in FIG. 7B is produced.

Next, a product pattern (not shown), of the patterns formed in the manner as mentioned above, is subjected to a pattern defect inspection through use of an SEM or optical microscope. If defective patterns are found, the positions (coordinates) of defective patterns are specified while the patterns corresponding the mask dimension inspection marks 13 are taken as the points of origin (coordinate standards).

As mentioned above, utilizing mask dimension inspection marks 13 as coordinate standards when the coordinates of a defective pattern are specified during pattern defect inspection is effective for accurate specification of coordinates of the defective patterns.

However, the mask dimension inspection marks 13 are miniaturized for their originally-intended purposes in association with miniaturization of a semiconductor device and the product pattern 2.

Therefore, the mask dimension inspection marks 13 patterned onto a semiconductor substrate by use of the conventional photo mask 10 are difficult to find.

Particularly, since the mask dimension inspection marks 13 are miniaturized; namely, since the line patterns 4 are miniaturized, as shown in FIG. 7A, the opening sections 28 are completely embedded even when the tungsten film 26 is formed to a small extent, as shown in FIG. 7B. Further, if the wafer is smoothed by means of CMP after the formation of tungsten film 26, the surface of the wafer assumes a mirror state, thereby rendering the minute line patterns 4 much more difficult to find.

Therefore, at the time of pattern defect inspection, it is difficult to use the mask dimension inspection marks patterned onto the semiconductor substrate as coordinate standards. Hence, accurate specification of coordinates of a defective pattern cannot be carried out.

SUMMARY OF THE INVENTION

The present invention has been conceived to solve the previously-mentioned problems and a general object of the present invention is to provide a novel and useful photo mask to be used for photolithography, and is to provide a novel and useful method of inspecting a pattern defect, and is to provide a novel and useful method of manufacturing a semiconductor device.

A more specific object of the present invention is to perform inspecting operation of a pattern defect utilizing mask dimension inspection marks drawn on a photo mask.

The above object of the present invention is attained by a following photo mask to be used for photolithography, and by a following a method of inspecting a pattern defect, and by a following method of manufacturing a semiconductor device.

According to one aspect of the present invention, a photo mask to be used for photolithography comprises a product pattern; and a mask dimension inspection mark which is provided around the product pattern, the mask dimension inspection mark including a line pattern whose line width is equal to that of the product pattern, the mask dimension inspection mark including a reference pattern disposed adjacent to the line pattern, the reference pattern being a pattern of greater width than the line pattern.

Accordingly, the photo mask including the mask dimension inspection mark which can be used as coordinate standards for pattern defect inspection can be provided.

According to another aspect of the present invention, in a method of inspecting a pattern defect, a product pattern and a reference pattern are patterned on a semiconductor substrate by use of the above-mentioned photo mask. Next, a pattern defect is of the product pattern is inspected while the reference pattern is taken as a coordinate standard.

In the method of inspecting a pattern defect, a pattern defect inspection operation can be performed accurately by means of taking the mask dimension inspection marks as coordinate standards.

Further, since the pattern defect inspection operation can be performed accurately by means of taking the mask dimension inspection marks as coordinate standards, a highly-reliable semiconductor device can be manufactured.

Other objects and further features of the present invention will be apparent from the following detailed description when read in conjunction with the accompanying drawings.

DETAILED DESCRIPTION OF THE PREFERRED EMBODIMENTS

Figure 1:
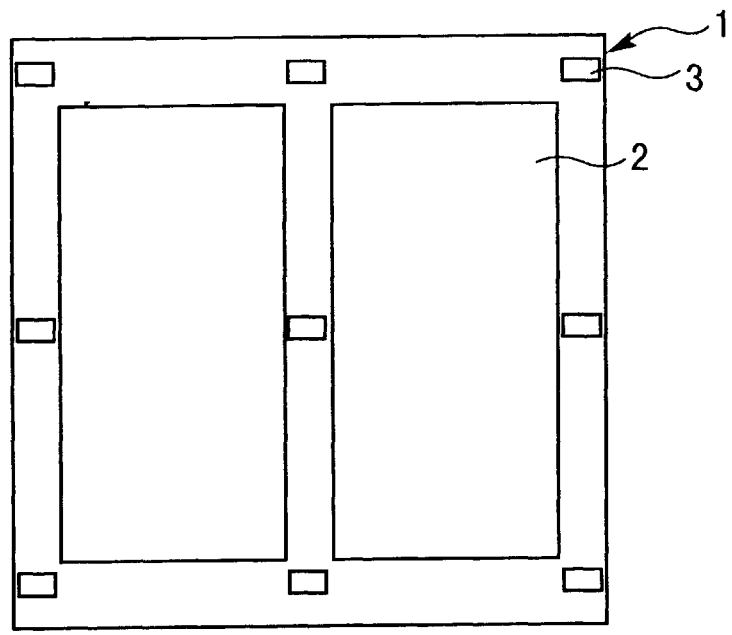
FIG. 1 is a view for describing a photo mask according to a first embodiment of the present invention.

In the following, principles and embodiments of the present invention will be described with reference to the accompanying drawings. The members and steps that are common to some of the drawings are given the same reference numerals and redundant descriptions therefore may be omitted.

First Embodiment

Figure 2A:
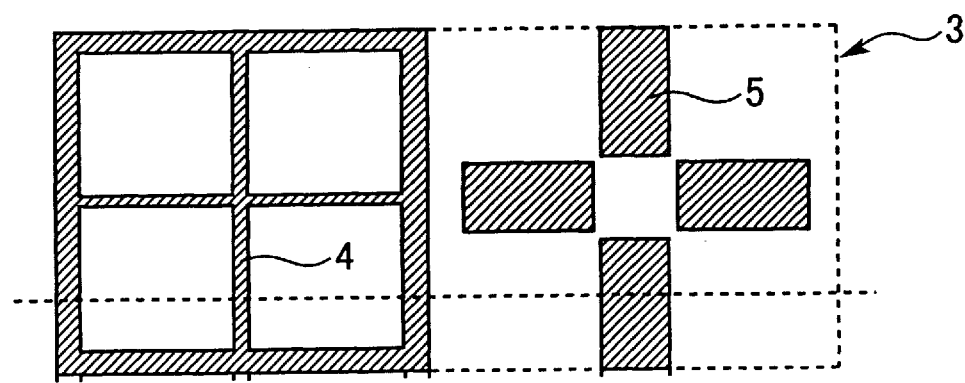
FIG. 2A is a view for describing the mask dimension inspection marks shown in FIG. 1.

FIG. 1 is a view for describing a photo mask according to a first embodiment of the present invention. FIG. 2A is a view for describing the mask dimension inspection marks shown in FIG. 1.

As shown in FIGS. 1 and 2A, reference numeral 1 designates a photo mask; 2 designates a product pattern; 3 designates a mask dimension inspection mark; 4 designates a line pattern; and 5 designates a reference pattern.

The photo mask 1 according to the present embodiment differs from the conventional photo mask 10 in the mask dimension inspection marks 3.

As shown in FIG. 1, the photo mask 1 is a reticle having product patterns 2 drawn thereon. The mask dimension inspection marks 3 are further drawn along at least the four sides of each of the product patterns 2. The photo mask 1 is used for a photolithography process, which is one of semiconductor manufacturing processes.

The product patterns 2 are circuit patterns of real product.

The mask dimension inspection marks 3 are for measuring the processing precision of a photo mask 1 at the time of manufacture thereof (which will be described in detail later).

As shown in FIG. 2A, the mask dimension inspection mark 3 includes a line pattern 4 and reference patterns 5 disposed adjacent to the line pattern 4.

The line pattern 4 has a width equal to that of the product pattern 2, i.e., equal to a line width of a product (semiconductor device) that is to be processed. For instance, if the product pattern 2 has a line pattern of 0.18 $\mu$m, the line pattern 4 of the mark 3 assumes a line width of 0.18 $\mu$m.

The line pattern 4 is used for measuring the processing accuracy of the photo mask 1, which is an intended purpose of the mask dimension inspection marks 3. By means of measuring the width of the line pattern 4 after production of the photo mask 1, the photo mask 1 is determined as non-defective or defective.

The reference pattern 5 is wider than the line pattern 4 and assumes a line width of, for example, 2 to 3 $\mu$m.

The reference pattern 5 is used not for determining the photo mask 1 as non-defective or defective, but is used as coordinate standards during a pattern defect inspection operation (which will be described later). Namely, positions of pattern defects (also called "defective patterns") are specified by means of taking as a reference the reference pattern 5 (which will be described later).

The above-described photo mask 1 can be summarized as follows: the photo mask 1 has the product patterns 2 and the mask dimension inspection marks 3 provided along the periphery of each of the product patterns 2. Each of the mask dimension inspection marks 3 comprises the line pattern 4 whose width is substantially identical with that of the product pattern 2, and the reference pattern 5 which is provided adjacent to the line pattern 4 and is wider than the line pattern 4 (which corresponds to the product pattern 2).

Next, a method of inspecting a pattern defect using the photo mask according to the first embodiment will be described.

Figure 2B:
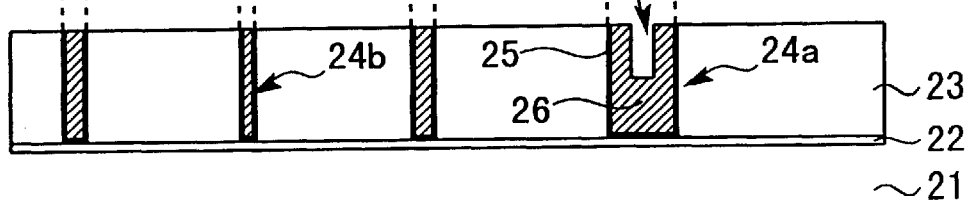
FIG. 2B is a cross-sectional view for describing a method of inspecting a pattern defect using the photo mask according to the first embodiment.

FIG. 2B is a cross-sectional view for describing a method of inspecting a pattern defect using the photo mask according to the first embodiment.

As shown in FIG. 2B, a silicon nitride film 22 is formed on a semiconductor substrate 21 to a thickness of about 500 angstroms by means of LPCVD (low-pressure chemical vapor deposition).

Next, a silicon oxide film 23 is formed on the silicon nitride film 22 to a thickness of about 8,000 angstroms by means of LPCVD. A photo resist film (not shown) is formed on the silicon oxide film 23.

Next, a resist pattern (not shown) is formed through use of the photo mask 1 shown in FIG. 1.

Next, the wafer is subjected to dry etching with the resist pattern as a mask. Thus, patterns (not shown) corresponding to the product patterns 2 shown in FIG. 2A are formed, and opening sections 24a corresponding to the reference patterns 5 and an opening section 24b corresponding to the line pattern 4 are formed in the silicon oxide film 23.

Subsequently, a barrier metal film 25 is formed from, e.g., TiN or TaN, on the internal surfaces of the opening sections 24a and 24 band the silicon oxide film 23 to a thickness of about 1,000 angstroms. For instance, a tungsten film 26 is further formed on the barrier metal film 25 to a thickness of about 4,000 angstroms, by means of sputtering.

Next, unnecessary portions of the tungsten film 26 and barrier metal film 25 are removed from the silicon oxide film 23 by means of the CMP technique, whereby a pattern structure such as that shown in FIG. 2B is produced.

Next, a product pattern (not shown), of the patterns formed in the manner as mentioned above, is subjected to a pattern defect inspection through use of an SEM or optical microscope. If defective patterns are found, the positions (coordinates) of defective patterns are specified while the patterns corresponding the mask dimension inspection marks 13 are taken as the points of origin (coordinate standards).

Here, as shown in FIGS. 2A and 2B, in accordance with the product patterns 2, the opening section 24b corresponding to the miniaturized line pattern 4 is fully embedded with the tungsten film 26.

On the contrary, the opening sections 24a corresponding to the reference patterns 5 are not fully embedded with the tungsten film 26, and hence a trench 27 remains in the surface of the opening sections 24a. Accordingly, since it is easy to find the trench 27, the mask dimension inspection marks 3 are effectively utilized as coordinate standards (points of origin) to be used during pattern defect inspection.

As mentioned above, in the photo mask 1 according to the present embodiment, each of the mask dimension inspection marks 3 includes a reference pattern 5 wider than a line width to which the product pattern 2 is to be processed.

The wafer is subjected to photolithography through use of the photo mask 1 and etching, whereby patterns corresponding to the reference patterns 5 are formed on the semiconductor substrate 21. For instance, each of the patterns assumes a width of 2 to 3 $\mu$m and is wider than the line width of the product pattern 2.

Therefore, even when the product patterns 2 are miniaturized, the patterns corresponding to the reference patterns 5 can be used as coordinate standards for pattern defect inspection.

The accuracy of coordinates can be improved at the time of specification of defective patterns. As a result, pattern defect inspection can be effected accurately, thereby enabling manufacture of a highly-reliable semiconductor device.

In the present embodiment, the four reference patterns 5 included in each of the mask dimension inspection marks 3 are arranged in the manner as shown in FIG. 2A. The number or layout of the reference patterns 5 is not limited to this example. For instance, one reference pattern 5 may be provided adjacent to the line pattern 4.

The position in which the reference pattern 5 is to be arranged is not limited to a position adjoining the line pattern 4; so long as the reference patterns 5 are provided on the photo mask 1 and in the vicinity of the product patterns 2, the positions of the reference patterns 5 are arbitrary.

The reference pattern 5 is set so as to assume a width of 2 to 3 $\mu$m. However, if the reference patterns 5 assume a recognizable width during the pattern defect inspection operation, the width may be set to any value.

In the present embodiment, the pattern defect inspection operation has been performed after the smoothing process. The pattern defect inspection operation may be performed before and after another manufacturing process, so long as the photolithography process using the photo mask 1 is finished.

Next, a modification of the photo mask according to the present embodiment will be described. More particularly, modification of a mask dimension inspection mark will be described.

Figure 3:
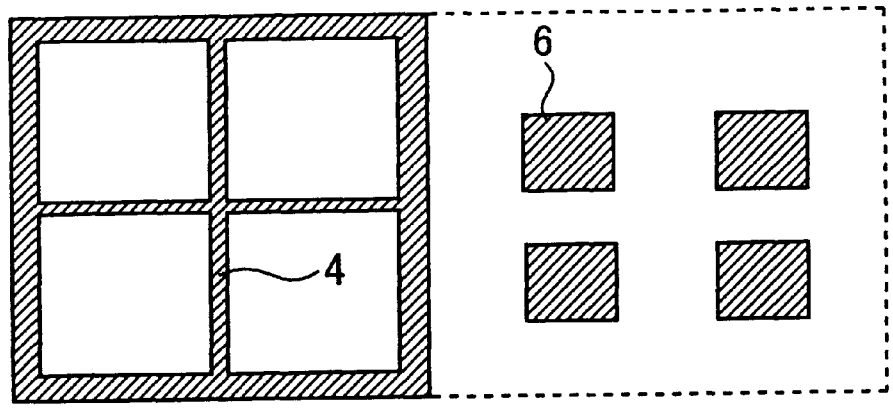
FIG. 3 is a view for describing a first modification of mask dimension inspection marks disposed on the photo mask according to the present embodiment.
Figure 4:
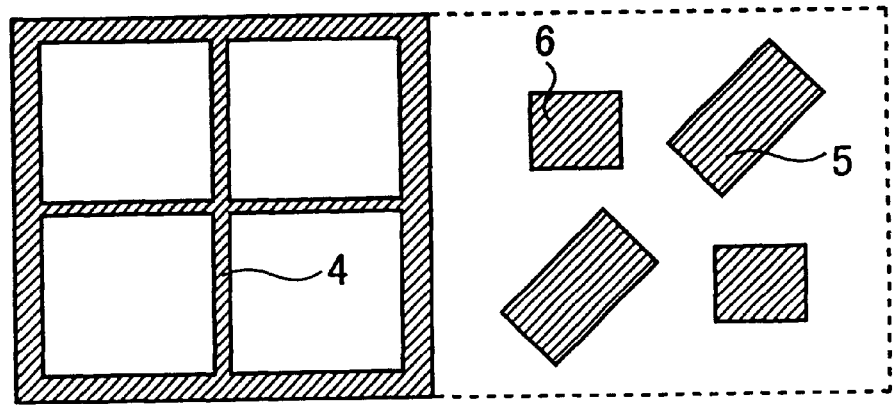
FIG. 4 is a view for describing a second modification of the mask dimension inspection marks disposed on the photo mask according to the present embodiment.
Figure 5:
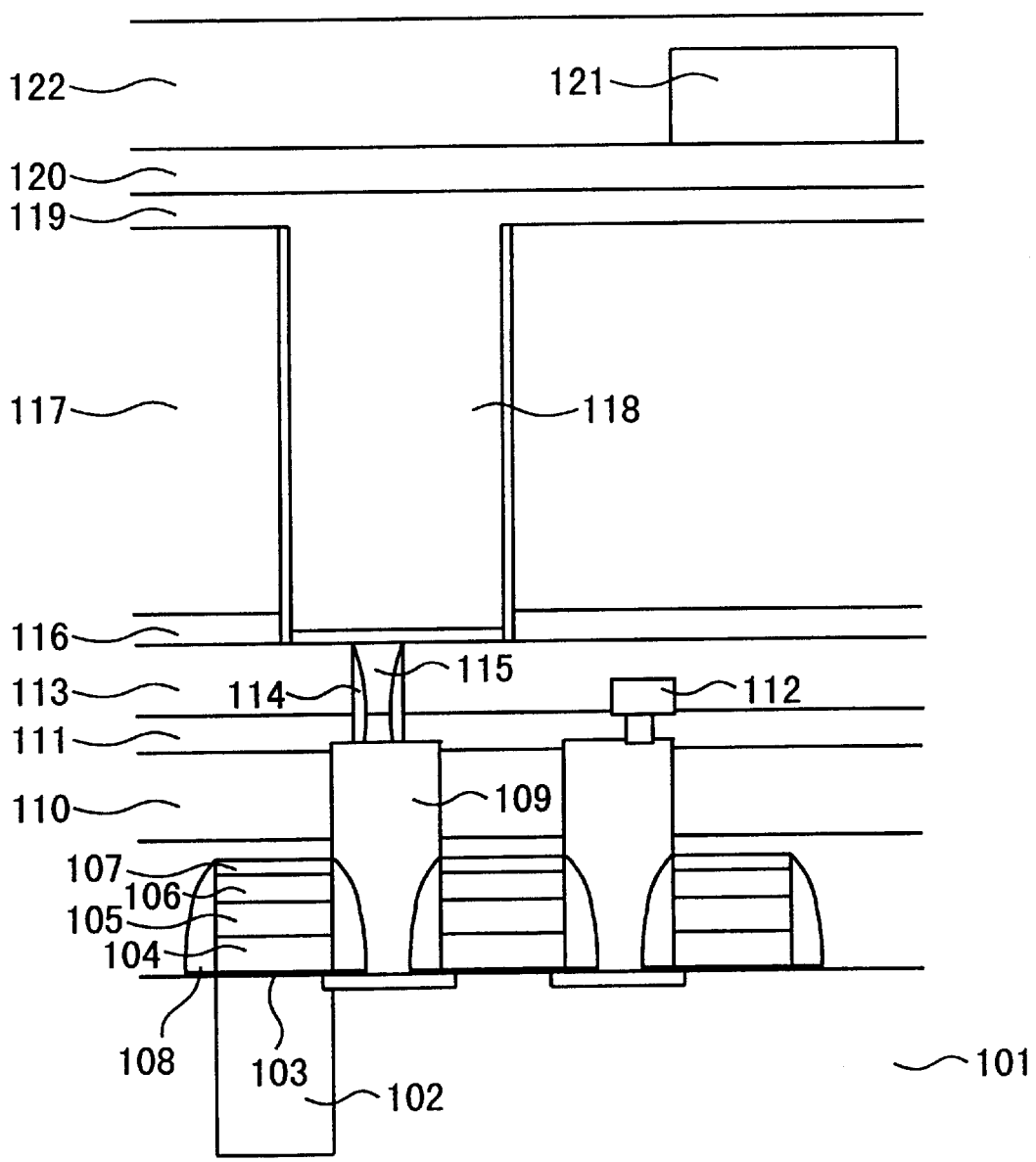
FIG. 5 is a cross-sectional view for describing the structure of DRAM acting as a common semiconductor device.
Figure 6:
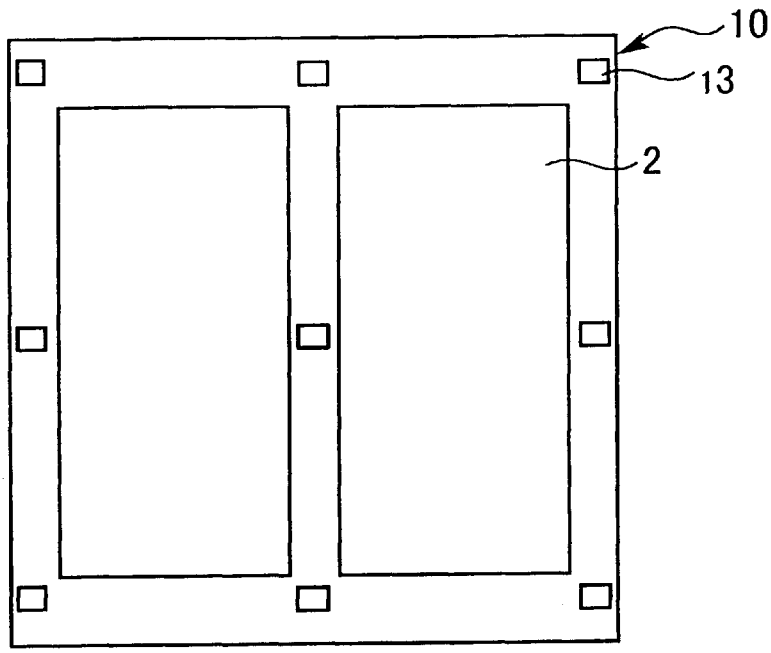
FIG. 6 is a view for describing a conventional photo mask.
Figure 7A:
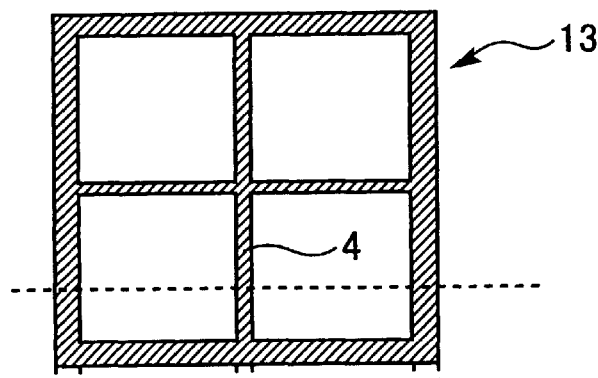
FIG. 7A is a view for describing a conventional mask dimension inspection mark shown in FIG. 6.
Figure 7B:
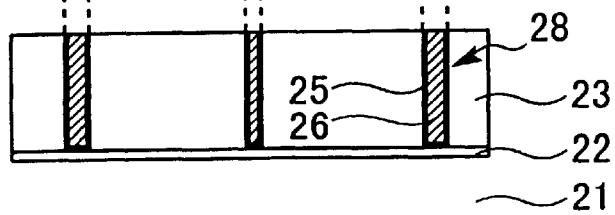
FIG. 7B is a cross-sectional view for describing a method of inspecting a pattern defect using a conventional photo mask.

FIG. 3 is a view for describing a first modification of mask dimension inspection marks disposed on the photo mask according to the present embodiment. FIG. 4 is a view for describing a second modification of the mask dimension inspection marks disposed on the photo mask according to the present embodiment.

The mask dimension inspection marks shown in FIG. 3 differ from those shown in FIG. 2A in that the reference patterns 6 are not line patterns but pad patterns. For instance, the width of the pad pattern 6 serving as the reference pattern 6 is 2 to 3 $\mu$m.

Even when the reference pattern is the pad pattern 6, there is yielded an advantage similar to that yielded by the line pattern 5. Namely, the reference pattern 6 formed on the semiconductor substrate by means of the photolithography process can be used as a coordinate reference at the time of pattern defect inspection. Accordingly, the coordinates of a defective pattern can be specified accurately.

In each of the mask dimension inspection marks 3 shown in FIG. 4, the reference pattern includes the line patterns 5 shown in FIG. 2A and the pad patterns 6 shown in FIG. 3.

Even in this case, the reference patterns (line patterns) 5 or the reference patterns (pad patterns) 6 formed on the semiconductor substrate by means of the photolithography process can be used as a coordinate reference during pattern defect inspection. Accordingly, the coordinates of a defective pattern can be specified accurately.

This invention, when practiced illustratively in the manner described above, provides the following major effects:

According to a first aspect of the present invention, a photo mask including mask dimension inspection marks which can be used as coordinate standards for pattern defect inspection can be provided.

According to a second aspect of the present invention, a pattern defect inspection operation can be performed accurately by means of taking the mask dimension inspection marks as coordinate standards.

According to third aspect of the present invention, since the pattern defect inspection operation can be performed accurately by means of taking the mask dimension inspection marks as coordinate standards, a highly-reliable semiconductor device can be manufactured.

Further, the present invention is not limited to these embodiments, but variations and modifications may be made without departing from the scope of the present invention.

The entire disclosure of Japanese Patent Application No. 2000-384127 filed on Dec. 18, 2000 containing specification, claims, drawings and summary are incorporated herein by reference in its entirety.

What is claimed is:

1. A photo mask to be used for photolithography comprising:

a product pattern; and a mask dimension inspection mark which is provided around said product pattern, said mask dimension inspection mark including a line pattern whose line width is equal to that of said product pattern, said mask dimension inspection mark including a reference pattern disposed adjacent to said line pattern, said reference pattern being a pattern of greater width than said line pattern.

2. The photo mask to be used for photolithography according to claim 1, wherein said reference pattern includes a line pattern of 2 to 3 $\mu$m width.

3. The photo mask to be used for photolithography according to claim 2, wherein said reference pattern further includes a pad pattern of 2 to 3 $\mu$m width.

4. The photo mask to be used for photolithography according to claim 1, wherein said reference pattern includes a pad pattern of 2 to 3 $\mu$m width.

5. The photo mask to be used for photolithography according to claim 1, wherein said mask dimension inspection mark is provided in at least four corners of said product pattern.

6. A method of inspecting a pattern defect comprising the steps of:

patterning a product pattern and a reference pattern on a semiconductor substrate by use of the photo mask according to claim 1; and inspecting a pattern defect of said product pattern while said reference pattern is taken as a coordinate standard.

7. A method of manufacturing a semiconductor device comprising the steps of:

patterning a product pattern and a reference pattern on a semiconductor substrate by use of the photo mask according to claim 1; and inspecting a pattern defect of said product pattern while said reference pattern is taken as a coordinate standard.

* * * * *